United States Patent [19]

Bergmann et al.

[11] Patent Number: 4,758,280

[45] Date of Patent: Jul. 19, 1988

[54] DECORATIVE BLACK WEAR PROTECTION COATING

[75] Inventors: Erich Bergmann, Mels, Switzerland; Peter Nüesch, Balzers, Liechtenstein

[73] Assignee: Balzers Aktiengesellschaft, Liechtenstein

[21] Appl. No.: 2,967

[22] Filed: Jan. 13, 1987

[30] Foreign Application Priority Data

Jan. 16, 1986 [CH] Switzerland ............ 00139/86

[51] Int. Cl.$^4$ .................... B32B 9/00; C09D 1/00
[52] U.S. Cl. .................... 106/286.4; 427/38; 428/472
[58] Field of Search ............ 106/286.1, 286.4; 423/365; 75/233; 428/472; 427/38

[56] References Cited

U.S. PATENT DOCUMENTS

| | | | |
|---|---|---|---|
| 3,492,100 | 1/1970 | Roubin | 423/365 |
| 3,872,136 | 3/1975 | Middelhoek | 501/87 |
| 4,212,670 | 7/1980 | Shveikin et al. | 75/233 |
| 4,357,382 | 11/1982 | Lambert et al. | 428/212 |
| 4,476,102 | 10/1984 | MeCandish et al. | 501/87 |
| 4,643,952 | 2/1987 | Kurakata | 428/472 |

*Primary Examiner*—Theodore Morris
*Attorney, Agent, or Firm*—McGlew & Tuttle

[57] ABSTRACT

Conventional black coatings for objects of common use usually formed as a carbon layer or porous metal layers, have a deficient wear resistance and surface quality. The resistant high gloss black coatings according to the invention comprise oxycarbonitrides, the proportion of carbon. Preferably the layer comprises an oxycarbonitride of an alloy of Ti, Zr and Hf, the oxygen component between 40 and 60 atom percent. Use of the invention is mainly for decorative utility objects, e.g. watch cases.

8 Claims, No Drawings

DECORATIVE BLACK WEAR PROTECTION COATING

FIELD AND BACKGROUND OF THE INVENTION

This invention relates in general to coating compositions and in particular to a new and useful decorative black wear protection coating.

The blackening of metal objects by substoichiometric oxide coatings is a process long known. Thus, for example cutting tools of high-speed steel are "drawn" by means of steam, i.e. they are subjected to oxidation in a very thin zone near its surface. The black oxide layer thus produced sometimes increases the wear resistance somewhat, in that it reduces the so-called adhesion wear. Additional similar methods are known, which in part are combined with phosphatizing. As the specialist knows, all these known methods lead to coatings which, though suitable for purely decorative purposes, are not suitable for real wear protection; they have too little resistance both to chemical attack and to mechanical abrasion. These methods, therefore, have hardly been used anymore for decades. Also the so-called black eloxizing falls in this category. The black decorative wear protection coatings common today are produced by electro-plating and are usually black chrome or black nickel coatings, that is, cermets (mixtures of metal with ceramic material) of the respective metals with their oxides, which due to their low light dispersion create the impression of black coloration. Such coatings still have, as is known, great deficiencies with regard to wear resistance, surface quality and skin compatibility.

It is known also that with titanium compounds one can obtain coatings of different coloration, from golden yellow titanium nitride and aubergine colored to brown carbonitrides to the blue oxides of so-called Magnelli phases. Characteristic of all these coatings is their diversity of color. It has, however, not been possible until now to produce black layers on this basis; only light gray films could at best be produced (with carbides).

Lastly it was known also to apply decorative carbon layers on objects, in that carbon was precipitated by cathode sputtering as a relatively loose film on the surfaces of the objects. These films were better than the films, also long known, which were obtained by vapor deposition of metals, e.g. platinum, in a residual gas greatly dispersing the vaporized molecules, and which also appeared black because of their structure with many cavities (porosity). But because of their insufficeint mechanical resistance for applications where relatively high mechanical stress during the period of use must be expected, in particular for applications as objects of daily use, none of the known black coatings constituted a real solution.

SUMMARY OF THE INVENTION

The present invention provides black wear protection coatings which are hard and adhering and also satisfy decorative requirements, in particular coatings with a smooth surface, which can be applied over relatively large areas with uniform coloration. These new black wear protection layers, which comprise oxycarbonitrides of metals of Group 4b of the Periodic Table of Elements having an oxygen component, measured in atom percent which outweighs the proportion of nitrogen and of carbon in the coating.

Especially suitable for the practice of the invention have proved to be the oxycarbonitrides of pure titanium and alloys of titanium, zirconium and hafnium. To be recommended are oxygen contents of between 40 and 65 atom percent of the layer as a whole, or respectively with 0.95 to 1.5 times the metal content. As a variant of the invention it is further proposed to select the ratio of the number of nitrogen atoms to the number of oxygen atoms in the film between 0.1 and 0.4 and the ratio of the number of carbon atoms to the number nitrogen atoms between 0.6 and 2.

Accordingly it is an object of the invention to provide a decorative wear protection coating which comprises an oxycarbonitride of a metal of the periodic table Group 4 of chemical elements which has an oxygen component measured in an atom percent which outweighs the proportion of nitrogen and of carbon in the coating A further object of the invention is to provide a protective coating which is durable and long lasting and inexpensive to manufacture.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

DESCRIPTION OF THE PREFERRED EMBODIMENTS

The invention is explained more specifically with reference to some embodiment examples:

In an apparatus for the coating of workpieces by means of cathode sputtering cathodes of pure titanium are used, the mounts are loaded with workpieces to be coated, and the apparatus is evacuated to a vacuum of about 0.01 Pascal. Then the surfaces of the workpieces are subjected to cleaning, in that the apparatus is filled with argon to a pressure of 2.8 and an electric gas discharge is carried out between the workpieces and an auxiliary electrode or the wall of the vacuum chamber. For subsequent coatings, oxygen, nitrogen, carbon monoxide and carbon dioxide are admitted, and the argon flow is decreased until about the following partial pressures of the gas mixture (which can be measured e.g. by means of a mass spectrometer in a reference volume) are reached:

| | |
|---|---|
| argon | $3.2 \times 10^{-5}$ mbar |
| oxygen | $3.5 \times 10^{-7}$ mbar |
| nitrogen/carbon monoxide | $3.5 \times 10^{-7}$ mbar |
| carbon dioxide | $1.2 \times 10^{-8}$ mbar |

The total pressure is about 0.9 Pa.

Now in order to coat the workpieces by cathode sputtering, the cathodes are connected to a negative potential of 700 V relative to the workpieces, and at the stated pressure of the gas atmosphere in the coating chamber an electric gas discharge is ignited with a current strength of about 30 mA per $cm^2$ of cathode surface. From the surface of the titanium cathodes titanium atoms are the sputtered off. On the workpiece surfaces, arranged at a distance of for example 8 cm, layers consisting of compounds of titanium with nitrogen, oxygen and carbon are the precipitated due to the presence of the reactive gas atmosphere. Compared with the above-mentioned previously known layers, these layers are pitch black and at the same time hard and adhesive. In the described embodiment example, it was possible to produce such coatings of a thickness of 0.6 micron in about 20 minutes coating time. Their optical properties, measured in the coordinate system CIELAB of the commission International d'Eclairage, are:

$L = 38.3$
$a = 3.2$
$b = +1.8$

In accordance with one example of the invention a decorative black wear protection coating is made which comprises an oxycarbonitride of a metal selected from Group 4 of the Periodic Table of chemical elements and which has an oxygen content which is measured in oxygen percent of from 40-65 percent of the entire coating and which outweighs the proportion of nitrogen and carbon in the coating.

The invention also comprises products such as a wear protection coating which comprises a carbonitride of a metal selected from the Periodic Table Group 4 of chemical elements which has an oxygen component measured in atom percent which outweighs the proportion of nitrogen and of carbon in the coating. The percentage of oxygen is from 40-65 percent of the entire coating.

Watchbands thus coated were subjected to the following wear and corrosion test:

In a polishing machine filled with a mixture of 700 g sea sand, 250 g sea pebbles, 500 cc water and 10 cc detergents, the coated workpieces were subjected to rotation for six hours (speed 42 rpm). Thereafter the workpieces were sprayed with artificial sweat (according to the proposal of the Bundesanstalt für Material prüfung-Material Testing Institution of the Federal Republic of Germany) and subsequently stored in saturated steam at 60° for 72 hours.

The wristband showed no alteration in this test treatment.

In a second example, in an apparatus for ion plating workpieces by electron beam vaporization (as described e.g. in U.S. Pat. No. 4,448,802), the vaporization crucible is filled with hafnium pellets, and then the apparatus is loaded with watchbands of the "Milanais" type of "Hastelloy", an alloy consisting of 53% Ni, 23% Fe and 1% Cr (by weight), which had previously been carefully cleaned by means of ion etching in a low-volt arc in argon of 0.08 Pa Pressure. After the ion etchng the electron beam vaporizer was turned on and the hafnium melted. During the melting, the low-volt arc discharge already used for ion etching was maintained. Also the argon pressure in the apparatus was left at 0.08 Pa. After the metal melt had reached a stable rate of vaporization out of the crucible of 50 g/min, a mixture of oxygen and carbon monoxide was admitted into the chamber, namely in the ratio of the partial pressures of 8:1:1. The gas flow was adjusted to 90 standard cubic centimeters per minute and the total pressure in the vapor deposition chamber was maintained at about 0.12 Pascal by continuous pumping. After one hour first the electron beam vaporizer and then the low-volt arc were turned off and finally the gas admission interrupted. Then the apparatus was opened, the wristbands had a pitch black coating, which showed a very good resistance to corrosion and wear.

In a third example, in an apparatus for coating workpieces by means of cathode consisted of an alloy of 99% zirconium and 1% hafnium, a third cathode sputtering of commercial high-purity titanium, and the fourth of a hard metal of 76% by weight TiC, 12% by weight $Mo_2C$ and 12% by weight Ni (known as "Tizit F05T").

This time the workpieces were spectacle frames of monel and German silver, which had previously been electroplated by a known technology with a 0.003 mm nickel layer. After the usual ion etching, argon was admitted until an argon pressure of 0.7 Pa had been reached. Thereupon the cathodes were fired, adjusting at the two first-named a current of 8 amperes each, on the third cathode a current of 9 amperes, and on the fourth cathode a current of 5 amperes. The turntable on which the workpieces were secured in this example rotated at a speed of 4 rpm. Then oxygen and nitrogen were admitted in a ratio of 3:1.

After about 10 minutes the cathodes were turned off again. The spectacle frames then had a black coating 0.001 mm thick, which showed a Vickers hardness of $HV_{0.015} = 1100$. Its composition was determined by energy-dispersive roentgen analysis. It was in percent by weight:

| Ti | Zr | Hf | Mo | N | O | N | C |
|---|---|---|---|---|---|---|---|
| 16.65 | 62.75 | 0.6 | 0.45 | 0.55 | 16.5 | 1.85 | 0.65% |

The carbon in the coating does not, in this last-named example, originate from a reaction with the gas in the coating chamber, but stems from the mentioned hard metal of the fourth cathodes.

The method for the preparation of the above coatings are known in themselves and not an object of the present invention. For example, the coating can be applied by cathode sputtering. But also the applying of coatings by means of other known methods of the coating techniques e.g. by means of the so-called Chemical Vapour Deposition (CVD) or utilizing all known possibilities of "Physical Vapour Deposition" (PVD) can be employed successfully.

While specific embodiments of the invention have been shown and described in detail to illustrate the application of the principles of the invention, it will be understood that the invention may be embodied otherwise without departing from such principles.

What is claimed is:

1. Decorative black wear protection coating, comprising of oxycarbonitrides of metals of Group 4 of the Periodic Table of chemical elements having an Oxygen component measured in atom percent which outweighs the proportion of nitrogen and of carbon in the coating.

2. A decorative black wear protection coating, comprising an oxycarbonitride of a titanium metal having an oxygen component which is measured in atom percent of from 40-60 percent of the entire coating and of from 95-150 percent in respect to titanium.

3. A wear protection coating according to claim 1, wherein said metal of said Periodic Table comprises an alloy of at least one of titanium, zirconium and hafnium.

4. A wear protection coating according to claim 1, wherein said metal is titanium.

5. A wear protection coating according to claim 1, wherein said oxygen content measured in atom percent is from 0.95 to 1.5 times the metal content.

6. A wear protection coating according to claim 1, wherein the ratio of the number of nitrogen atoms to the number of oxygen in said coating is from between 0.1 and 0.4.

7. A wear protection coating according to claim 1, wherein a ratio of the number of carbon atoms to the number of nitrogen atoms in said coating is 0.6 to 2.

8. A product made from a process in which a vaporization crucible is filled with hafnium pellets and a watchband is first ion etched in a low voltage arc in an argon gas at a pressure of 0.08 Pa, actuating an electron beam vaporizer so as to melt the hafnium and during melting maintaining a low volt arc discharge used for the ion etching and after the metal melt reaches a stable rate of vaporization out of the crucible of approximately 50 g/min admitting oxygen and carbon monoxide into the chamber in a ratio of a partial pressure of 8:1:1, adjusting the gas flow to a 190 standard cubic centimeters per minute and a total pressure in the vapor deposition chamber about 0.12 Pascal by continuous pumping and wherein, after one hour the electron beam vaporizer and then the low-volt arc are turned off and the gas admission is interrupted causing the articles to pick up a pitch black coating which shows a very good resistance to corrosion and wear.

* * * * *